United States Patent
Morizane et al.

(10) Patent No.: US 6,667,434 B2
(45) Date of Patent: *Dec. 23, 2003

(54) SOLAR CELL MODULE

(75) Inventors: Masashi Morizane, Osaka (JP); Shihomi Nakatani, Osaka (JP); Yukihiro Yoshimine, Osaka (JP); Sadaji Tsuge, Osaka (JP)

(73) Assignee: Sanyo Electric Co., LTD, Osaka (JP)

( * ) Notice: Subject to any disclaimer, the term of this patent is extended or adjusted under 35 U.S.C. 154(b) by 121 days.

This patent is subject to a terminal disclaimer.

(21) Appl. No.: 09/774,015

(22) Filed: Jan. 31, 2001

(65) Prior Publication Data

US 2001/0045505 A1 Nov. 29, 2001

(30) Foreign Application Priority Data

Jan. 31, 2000 (JP) ........................ 2000-022093
Jan. 31, 2000 (JP) ........................ 2000-022094
Jan. 25, 2001 (JP) ........................ 2001-017016

(51) Int. Cl.[7] .......................................... H01L 31/048
(52) U.S. Cl. ..................... 136/251; 136/244; 136/256; 257/433
(58) Field of Search ................. 136/251, 244, 136/256; 257/433

(56) References Cited

U.S. PATENT DOCUMENTS

| | | | | |
|---|---|---|---|---|
| 4,067,764 A | * | 1/1978 | Walker et al. | 136/251 |
| 4,210,462 A | * | 7/1980 | Tourneux | 136/251 |
| 4,321,418 A | * | 3/1982 | Dran et al. | 136/251 |
| 5,507,880 A |  | 4/1996 | Ishikawa et al. | |
| 5,626,688 A |  | 5/1997 | Probst et al. | |
| 5,728,230 A |  | 3/1998 | Komori et al. | |
| 6,077,722 A | * | 6/2000 | Jansen et al. | 438/74 |
| 6,294,722 B1 | * | 9/2001 | Kondo et al. | 136/244 |
| 6,300,556 B1 | * | 10/2001 | Yamagishi et al. | 136/251 |
| 6,441,299 B2 | * | 8/2002 | Otani et al. | 136/251 |
| 2001/0011552 A1 | * | 8/2001 | Morizane et al. | 136/251 |
| 2002/0020440 A1 | * | 2/2002 | Yoshimine et al. | 136/251 |
| 2002/0153038 A1 | * | 10/2002 | Umemoto et al. | 136/251 |
| 2003/0010377 A1 | * | 1/2003 | Fukuda et al. | 136/251 |
| 2003/0010378 A1 | * | 1/2003 | Yoda et al. | 136/251 |
| 2003/0029493 A1 | * | 2/2003 | Plessing | 136/251 |

FOREIGN PATENT DOCUMENTS

| | | | |
|---|---|---|---|
| EP | 0499950 A2 | | 8/1992 |
| EP | 0860886 A2 | | 8/1998 |
| JP | 59-189681 A | * | 10/1984 |
| JP | 5-221683 A | * | 8/1993 |

OTHER PUBLICATIONS

European Search Report, dated Sep. 20, 2001.

* cited by examiner

*Primary Examiner*—Alan Diamond
(74) *Attorney, Agent, or Firm*—Arent Fox Kintner Plotkin & Kahn, PLLC

(57) ABSTRACT

A solar cell module including a plurality of solar cell elements 1 sealed by EVA resin between a front surface glass 20 and a rear surface member 5 is provided with a sodium diffusion preventing layer of a PET film 6 of a smaller water vapor transmission rate than those of the EVA sheets 3, 4 interposed between the front surface glass 20 and the solar cell elements 1.

3 Claims, 4 Drawing Sheets

SOLAR CELL MODULE

BACKGROUND OF THE INVENTION

1. Field of the Invention

This invention relates to a solar cell module, particularly relates to a two-side incidence type solar cell module capable of entering light from both front and rear surfaces provided with transparent front and rear surface members.

2. Description of Prior Art

Because solar light is unexhausted energy, a solar cell device for directly converting light energy into electrical energy has been developed as energy source for substituting with environmentally harmful fossil fuel such as petroleum and coal. A plurality of solar cell elements are electrically connected in series or in parallel with each other to form a solar cell module and increase an output. And the solar cell module can be used as a practical energy source.

A conventional solar cell module which generates power on a one side surface is so structured that a plurality of solar cell elements 110 between a front surface glass 100 and a rear surface member 101 are sealed with transparent and insulative resin 102 such as EVA (ethylene vinyl acetate).

The solar cell element 110 contains semiconductor material such as single crystalline silicon, polycrystalline silicon, or the like, and the solar cell elements 110 are connected in series by connection member 111 of a metal thin plate such as a copper foil plate or the like. The rear surface member 101 has a lamination film with a metal foil such as an aluminum (Al) foil or the like sandwiched with plastic films so that water entrance from a rear surface can be prevented.

The solar cell module is integrally formed by sandwiching the solar cell element 110 between the front surface glass 100 and the rear surface member 101 with a resin sheet of EVA or the like of 0.4–0.8 mm in thickness interposed and heating it at a reduced pressure.

On the other hand, a two-side incidence type solar cell element has been proposed, which is so structured that an electrode on a rear surface not only an electrode on a front light incidence side is a transparent electrode. With this structure, light is incident from both of the front and rear surfaces of the solar cell element. The rear surface of this solar cell element is formed of transparent material.

In the meantime, a solar cell module should be weather proof in order to withstand long-term use in outside. The above conventional two-side incidence type structure uses transparent material for the rear surface member. When a transparent resin film is used as the rear surface member, water is likely to enter as compared with a lamination film with a metal foil sandwiched with plastic films. Therefore, it is necessary to take water penetration into consideration. Although a film of a small water vapor transmission rate has been proposed as a transparent resin film, it still requires to be improved.

SUMMARY OF THE INVENTION

This invention was made to solve this problem and provides a solar cell module capable of improving reliability by improving moisture proofness.

Furthermore, this invention was made to improve reliability of the solar cell module by reducing water reaching to the front surface glass when the rear surface member is the resin film and suppressing the sodium ions deposited from the front surface glass from reaching to the front surface of the solar cell elements.

A solar cell module of this invention comprises a light transmitting member on a front surface side containing at least sodium, a rear surface member, a plurality of solar cell elements sealed with sealing resin between the light transmitting member on the front surface side and the rear surface member, and a sodium diffusion preventive function layer for preventing diffusion of sodium from the light transmitting member on the front surface side arranged between the light transmitting member on the front surface side and the solar cell elements.

The light transmitting member on the front surface side is glass, and the rear surface member is a transparent resin film.

The sodium diffusion preventing layer in this structure can suppress the sodium ions from reaching to the solar cell element and the moisture proofness can be improved. Degradation of power generation performance of the solar cell retards and a solar cell module of high reliability capable of withstanding long-term use in outside can be provided.

The sodium diffusion preventive function layer is sealing resin of not less than 1.0 mm in thickness arranged between the light transmitting member on the front surface side and the solar cell element.

With this structure, a distance between the front surface glass and the solar cell element can increase and the sodium ions deposited from the front surface glass retard from reaching to the solar cell element. Therefore, degradation of power generation performance of the solar cell retards and a solar cell module of high reliability capable of withstanding long-term use in outside can be provided.

The sodium diffusion preventive function layer is a resin layer of smaller water vapor transmission rate than that of the sealing resin.

With this structure, the sodium ions deposited from the front surface glass can be blocked at the resin layer of smaller water vapor transmission rate, and degradation of power generation of the solar cell element can be prevented.

The resin layer is a resin film inserted between the light transmitting member on the front surface side and the solar cell element.

The resin film is inserted at least in a region corresponding to the solar cell element.

The resin film is a PET film.

With this structure, the sodium ions deposited from the front surface glass can be blocked by the PET film, and degradation of power generation performance at the solar cell element can be prevented.

The sodium diffusion preventive function layer can be formed on a surface on a side of the sealing resin of the light transmitting member on the front surface side, and can be formed of an inorganic oxide layer, a nitride layer, or a fluoride layer.

With this structure, the sodium ions are prevented from reaching to the solar cell element, and the moisture proofness can be improved.

The sodium diffusion preventive function layer is formed by reforming process of a surface of the light transmitting member on the front surface side.

When reforming a surface of the glass, the sodium in the glass easy to move is molten out in the molten salt, and alkaline in the molten salt is diffused in the glass. As a result, deposition of the sodium ions from the glass is reduced to suppress the sodium ions from reaching to the solar cell element and improve the moisture proofness.

The sodium diffusion preventive function layer can be formed of glass member containing not more than 5 wt. % of sodium.

Thus, deposition of the sodium ions is prevented because the sodium contained is less, and the sodium ions are suppressed from reaching to the solar cell element to improve the moisture proofness.

The water vapor transmission rate of the transparent resin film is not more than 6.3 g/m²·day.

With this structure, increase of water in the sealing resin between the front surface glass and the solar cell element can be prevented.

An inorganic oxide layer, a nitride layer, or a fluoride layer may be formed on a surface of the transparent resin film.

The inorganic oxide layer, the nitride layer, or the fluoride layer has water barrier properties and function as a water vapor transmission preventing layer.

The foregoing and other objects, features, aspects and advantages of the present invention will become more apparent from the following detailed description of the present invention when reviewed in conjunction with the accompanying drawings.

DESCRIPTION OF PREFERRED EMBODIMENTS

Figure 11:
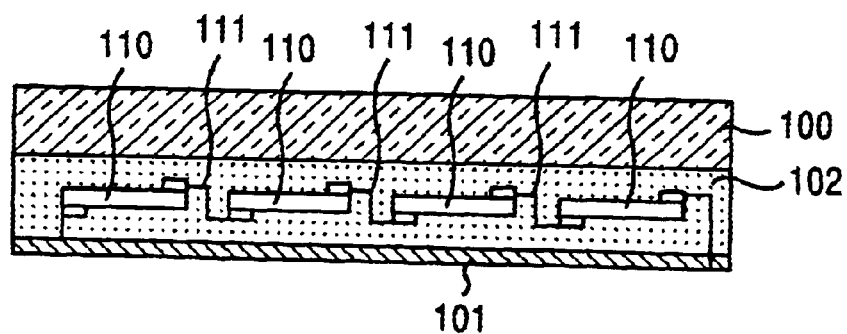
FIG. 11 is a side view of the conventional solar cell module.

First of all, the invention was made under the following condition. A solar cell module shown in FIG. 11 including a lamination film of an aluminum foil sandwiched with polyvinyl fluoride layers, and a solar cell module only including a PVF film are prepared, and a moisture proof test (JIS C8917) on the two modules are conducted to examine causes of degradation of power generation performance by water entrance. In this test, the modules are put in a thermostatic bath of 85° C., 93% RH for approximately 1000 hours and the solar cell characteristics are examined. An acceptable value of output is higher than 95%. In this test, the modules are put in the thermostatic bath for 1000 hours. The output change rate is 99.0% when the rear surface member is a lamination film, and the rate is 92.0% when the PVF film of 50 $\mu$m is used.

A quantity of sodium in the resin for sealing the solar cells 1 g of the solar cell module using the lamination film is 0.3 $\mu$g/g, and that of the solar cell module using only the PVF film is 3 $\mu$g/g. The quantity of sodium relates to the change rate of output, and as the quantity of sodium in the resin increases, the power generation performance degrades.

An increase of sodium quantity seems to result from the water entered in the module. The water enters from an outer periphery of the solar cell module when the rear surface member is the lamination film. On the other hand, when the rear surface member is the resin film, water enters not only from the outer periphery of the solar cell module but also from the resin film. As a result, when the rear surface member is the resin film, the water entering in the module increases.

When the water enters in the module, the sodium ions deposited from the front glass migrate in the resin containing water to reach to the front surface of the solar cell element, and further diffuse in an inside of the solar cell element to degrade the power generation performance of the solar cell. As a result, the power generation performance seems to degrade when the rear surface member is the resin film as compared with the lamination film.

This invention was made to improve reliability of the solar cell module by reducing water reaching to the front surface glass when the rear surface member is the resin film and suppressing the sodium ions deposited from the front surface glass from reaching the front surface of the solar cell elements.

Explanation is made on the embodiments by referring to the drawings.

Figure 1:
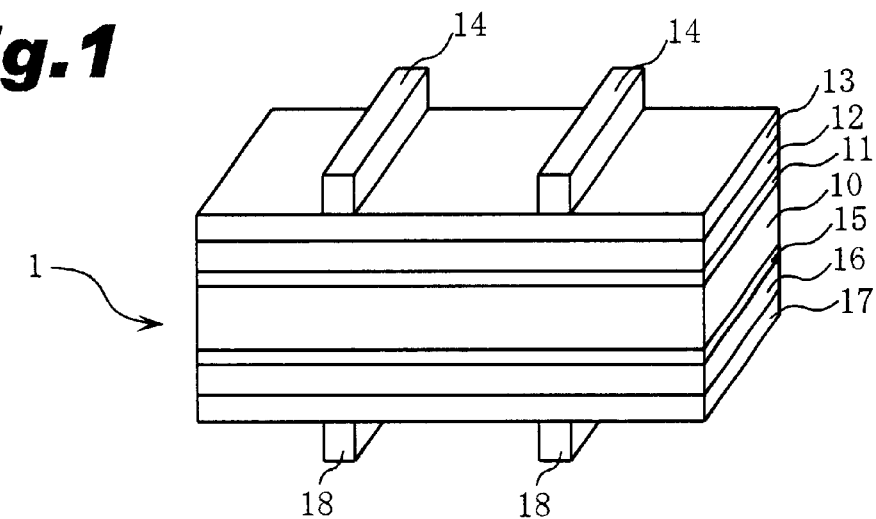
FIG. 1 is a schematic perspective view illustrating one example of a solar cell element capable of entering light from both front and rear surfaces.

One example of a solar cell element 1 used in this invention is explained by referring to FIG. 1. FIG. 1 is a schematic perspective view illustrating one example of a solar cell element capable of entering light from both front and rear surfaces. This solar cell element is so structured that intrinsic amorphous silicon is sandwiched between a single crystalline silicon substrate and an amorphous silicon layer (herein after referred as a HIT structure) in order to reduce defectives on the interface therebetween and improve hetero junction interface characteristics, and is capable of entering light from both front and rear surfaces.

As shown in FIG. 1, the solar cell element 1 includes an n-type single crystalline silicon substrate 10, an intrinsic amorphous silicon layer 11, and a p-type amorphous silicon layer 12 formed in this order. A transparent electrode 13 on a light receiving side formed of ITO or the like is formed on an entire surface of the p-type amorphous silicon layer 12, and a comb-shaped collector 14 of silver (Ag) or the like is formed on the transparent electrode 13 on the light receiving side. A rear surface of the substrate 10 has a BSF (Back Surface Field) structure which introduces an internal electric field to the rear surface of the substrate; a high dope n-type amorphous silicon layer 16 is formed with an intrinsic amorphous silicon layer 15 interposed on a rear surface side of the substrate 10. A transparent electrode 17 on a rear surface side of ITO or the like is formed on an entire surface of the high dope n-type amorphous silicon layer 16, and a comb-shaped collector 18 of silver (Ag) or the like is formed thereon. The rear surface also has a BSF structure which the intrinsic amorphous silicon layer is sandwiched between the crystalline silicon substrate and a high dope amorphous silicon layer in order to reduce defective on the interface and improve characteristic of the hetero junction interface.

First Embodiment

The solar cell module used in the first embodiment includes four solar cell elements of the HIT structure arranged 2×2 in matrix and are connected in series and in parallel by two elements with connection member (not shown). The plurality of solar cell elements 1 are sealed by using EVA (ethylene vinyl acetate) resin between the front surface glass 20 and the rear surface resin film 5 to form the solar cell module.

The front surface glass 20 is a white plate glass of a template reinforced glass. Material of the glass includes approximately 15 wt. % of sodium oxide ($Na_2O$).

The first embodiment uses the rear surface member 5 of a lamination film with an aluminum (Al) foil sandwiched with PVF (polyvinyl fluoride) so as to prevent water entrance from the rear surface.

Figure 2:
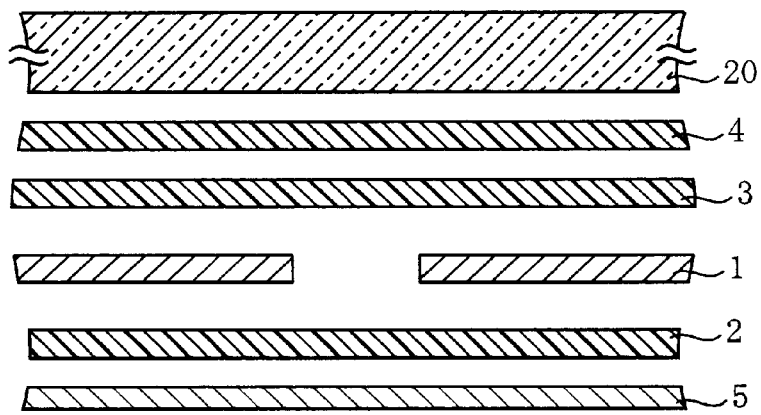
FIG. 2 is an exploded side view of the solar cell module according to the first embodiment of this invention.
Figure 3:
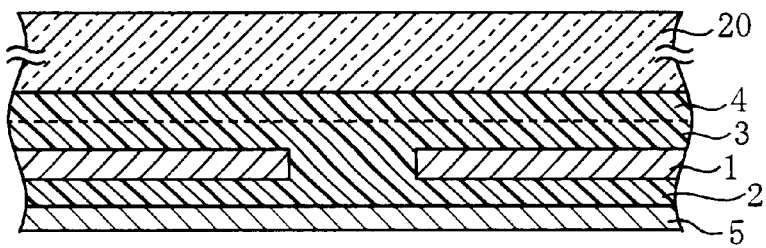
FIG. 3 is a side view of the solar cell module according to the first embodiment of this invention.

In the first embodiment of FIGS. 2, 3, EVA resin sheets 3, 4 respectively of 0.6 mm and 0.4 mm in thickness, to be 1.0 mm in total, are superimposed between the front surface glass 20 and the solar cell elements 1. An EVA resin sheet 2 of 0.6 mm in thickness is interposed between the solar cell element 1 and the rear surface resin film 5. The EVA resin on the front surface glass 20 side may be an EVA sheet of 1.0 mm.

The solar cell module is formed by sandwiching the solar cell elements 1 with the EVA resin sheets 3, 4 of totally 1.0 mm and the EVA sheet 2 of 0.6 mm between the front surface glass 20 and the rear surface member 5, and heating it at a reduced pressure to integrate the layers. Each of the layers is arranged as shown in FIG. 2, and is retained in a vacuumed bath at approximately 100 Pa. Then, this lamination structure is heated to be 150° C. and is pressed with a silicone sheet from the rear surface resin film 5 side by using atmospheric pressure. Through these processes, the EVAs 2, 3, 4 are softened and are tentatively adhered. Then, it is retained for approximately one hour in a thermostatic bath of approximately 150° C., and the EVAs 2, 3, 4 are cross-linked. The plurality of solar cell elements 1 are sealed with the EVA resin 2, 3, 4 between the front surface glass 20 and the rear surface member 5 as shown in FIG. 3.

A distance between the front surface glass 2 and the solar cell element 1 can increase in the solar cell module shown in FIG. 3; for example the distance can be doubled of one which has the single EVA sheet of 0.6 mm. As a result, the sodium ions deposited from the front surface glass 20 retards to reach to the solar cell element 1. As the thickness of the EVA sheet increases, the sheet functions as a sodium diffusion preventing layer for preventing diffusion of sodium ions deposited from the front surface glass 20. Therefore, degradation of power generation performance of the solar cell element can retard and a solar cell module of high reliability capable of withstanding long-term use in the outside can be provided.

Second Embodiment

Figure 4:
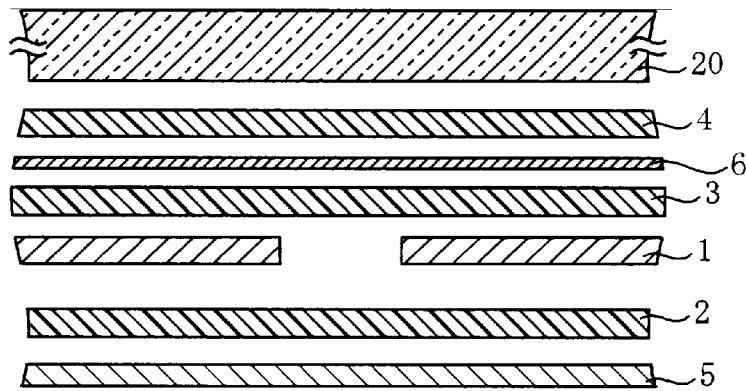
FIG. 4 is an exploded side view of the solar cell module according to the second embodiment of this invention.
Figure 5:
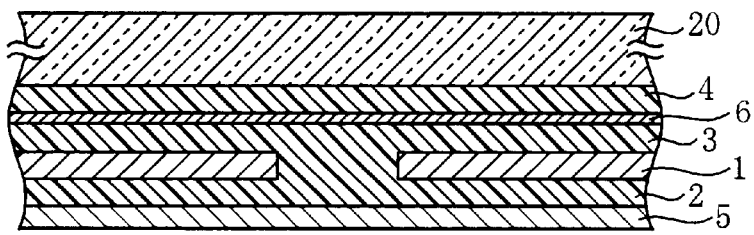
FIG. 5 is a side view of the solar cell module according to the second embodiment of this invention.

FIGS. 4, 5 explain the second embodiment of this invention. The same elements have the same reference numerals as in the first embodiment, and explanation on them is omitted.

As shown in FIGS. 4, 5, a plastic film 6 of a smaller water vapor transmission rate than that of EVA resin is inserted between the EVA resin sheets 3, 4 formed between the front surface glass 20 and the solar cell elements 1. PET film of low price is suitable for the plastic film 6. The thickness of the PET film is suitable to be more than 25 $\mu$m when considering workability. In the second embodiment, the PET film 6 of 50 $\mu$m is used. The PET film 6 can function as a sodium diffusion preventing layer capable of preventing diffusion of sodium ions deposited from the front surface glass 20. The thickness of the EVA resin sheets 3, 4 is suitable to be 0.2–0.6 mm when considering price and workability.

In the embodiment shown in FIG. 4, EVA resin sheets 3, 4 of 0.4 mm are arranged between the front surface glass 20 and the solar cell element 1 with the PET film 6 interposed therebetween. An EVA sheet 2 of 0.6 mm is formed between the solar cell element 1 and the rear surface member.

The above solar cell module includes the EVA sheet 4, the PET film 6, and the EVA sheet 3 interposed in this order between the front surface glass 20 and the solar cell elements 1. The EVA sheet 2 is sandwiched between the solar cell elements and the rear surface member 5, and is integrated by heating it under a reduced pressure. As shown in FIG. 5, the plurality of solar cell elements 1 are sealed with EVA resin between the front surface glass 20 and the rear surface member 5 to form the solar cell module.

The PET film 6 can block the sodium ions deposited from the front surface glass 20 in the solar cell module of this invention, and degradation of power generation performance of the solar cell elements 1 can be prevented.

The PET film 6 can function as a sodium diffusion preventing layer when it is formed at least in a region corresponding to the solar cell element 1.

The solar cell module of the structure according to this invention and a conventional solar cell module are prepared, and moisture proof test is conducted. This test is for examining characteristics of the solar cells before and after retained in a thermostatic bath of 85° C., 93% RH for 1000 hours. An acceptable value of an output is not lower than 95%. Also, moisture proof test in which the solar cell modules are retained in the bath of 85° C., 93% RH for 2000 hours is conducted. The results are shown in table 2.

The samples include a lamination film with an aluminum (Al) foil sandwiched with PVF (polyvinyl fluoride) so as to prevent water entrance from the rear surface. The thickness of the EVA resin 2 on the rear surface side is 0.6 mm. The conventional example has the same structure as of the invention except that the thickness of the EVA resin on a front surface side is 0.6 mm.

The structure of the first embodiment is shown in FIG. 3; the EVA sheets 3, 4 of respectively 0.6 mm and 0.4 mm in thickness on a front surface side make the total thickness of the EVA resin on the front surface side 1.0 mm. The structure of the second embodiment is shown in FIG. 5; the PET film 6 of 50 $\mu$m is interposed between the two EVA resin sheets 3, 4 of 0.4 mm in thickness. These samples are the solar cell module of one-side power generation type for entering light only from a side of the front glass 20. Degradation of initial characteristics of the samples are measured. The result of measurement of quantity of sodium (Na) in 1 g of the sealing resin after 1000 hours and 2000 hours are also shown in the table.

TABLE 1

| | Output characteristic change (%) | | | | |
| --- | --- | --- | --- | --- | --- |
| | Pmax | Voc | Isc | F.F. | Na quantity/ EVA |
| 1 Conventional example: EVA resin on a front surface side of 0.6 mm | 99.0 | 99.8 | 99.9 | 99.3 | 0.3 µg/g |
| 2 1st embodiment: EVA resin on the front surface of 1.0 mm | 99.2 | 99.7 | 99.9 | 99.6 | 0.2 µg/g |
| 3 2nd embodiment: PET film (50 µm) inserted between the front surface EVAs of 0.4 mm) | 99.5 | 99.9 | 99.9 | 99.7 | 0.1 µg/g |

TABLE 2

| | Output characteristic change (%) | | | | |
| --- | --- | --- | --- | --- | --- |
| | Pmax | Voc | Isc | F.F. | Na quantity/ EVA |
| 1 Conventional example: EVA resin on a front surface side of 0.6 mm | 93.9 | 98.5 | 99.5 | 95.8 | 2.0 µg/g |
| 2 1st embodiment: EVA resin on the front surface of 0.6 mm | 96.1 | 99.2 | 99.6 | 97.3 | 0.9 µg/g |
| 3 2nd embodiment: PET film (50 µm) inserted between the front surface EVAs of 0.4 mm) | 98.0 | 99.5 | 99.7 | 98.8 | 0.5 µg/g |

It is found from the table 1 that the rate of change in characteristics of the solar cell module of this invention is less than the conventional example after 1000 hours. In any cases of the conventional example and this invention, the characteristics of higher than 95% are maintained as compared with the initial characteristics, and the JIS standards are satisfied.

However, it is found from the table 2 that Pmax of the conventional example decreases to below 95% after 2000 hours and the characteristics are degraded. On the other hand, Pmax of the embodiments of this invention which the thickness of the EVA resin on the front surface side is 1.0 mm and which the PET film 6 is interposed between the two EVA resin sheets is 95%, and it is found that the moisture proofness is improved greatly as compared with the conventional structure.

Explanation on the water vapor transmission rate of each material is made. The water vapor transmission rate is measured by the Mocon method (JIS Z 0208-73).

The water vapor transmission rate of the EVA resin of 0.6 mm is 63 g/m²·day, the PET film of 50 µm is 12.6 g/m²·day, and the PVF film of 50 µm is 15 g/m²·day.

The water vapor transmission rate is inversely proportional to the thickness; for example when the thickness is doubled, the water vapor transmission rate is halved. Therefore, when the thickness of the EVA resin is 1.0 mm, the water vapor transmission rate is 37.8 g/m²·day.

When the thickness of the resin layer between the front surface glass 20 and the solar cell element 1 increases, or when the resin layer of smaller water vapor transmission rate than that of the sealing resin is interposed between them, sodium ions deposited form the front surface glass 20 are prevented from reaching to the solar cell elements 1, and degradation of power generation performance of the solar cell elements 1 can be prevented.

The above embodiment is about the solar cell module of one-side incidence type.

Explanation is made on application of this invention to the solar cell module of two-side incidence type. In the above embodiments, the film which aluminum is sandwiched with PVF is used as the rear surface member. In the solar cell module of two-side incidence type uses a transparent plastic film. Samples are prepared by using PET film and PVF film as the transparent plastic film, and the moisture proof test is conducted. This test is for examining characteristics of the solar cells before and after retained in a thermostatic bath of 85° C., 93% RH for 1000 hours. An acceptable value of an output is not lower than 95%. The results are shown in table 3. The sample is formed of a lamination film which an aluminum foil, as the rear surface member 5, is sandwiched with PVF films so as to prevent water entrance from the rear surface. The thickness of the EVA resin 2 on the rear surface side is 0.6 mm and the thickness of the EVA resin on the front side is 0.6 mm.

No. 2 sample uses a PVF film of 50 µm as the rear surface member 5 and has the same structure as the conventional one except that the thickness of the EVA resin on the front surface side is 0.6 mm. No. 3 sample uses the PET film of 50 µm as the rear surface member 5 and has the same structure as the conventional one except that the thickness of the EVA resin on the front surface side is 0.6 mm. No. 6 sample uses the PET film of 100 µm as the rear surface member 5 and has the same structure as the No. 3 sample except the thickness of the PET film. No. 5 sample uses the PET film of 50 µm as the rear surface member and has the same structure as the No. 3 sample except that the thickness of the EVA resin on the front surface side is 1.0 mm. The No. 4 sample uses the PET film of 100 µm as the rear surface member 5 and has the same structure as the conventional one except that the thickness of the EVA resin on the front surface side is 0.6 mm. The No. 5 sample has the structure shown in FIG. 3 with the PET film of 100 µm as the rear surface member 5 and the thickness of the EVA resin on the front surface side is 1.0 mm by combining the two EVA sheets 3, 4 of 0.6 mm and 0.4 mm respectively. No. 6 sample has the structure of FIG. 5, has the PET film of 50 μm as the rear surface member 5, and has the PET film 6 of 50 μm interposed between two EVA resin sheets 3, 4 of 0.4 mm. No. 1 sample is the one-side power generation module type which the light is incident only from a side of the front glass 20. The other samples are ones of a two-side incidence type which light is incident from both of front and rear surfaces. Degradation from the initial characteristics of the samples is measured. The quantity of sodium (Na) in 1 g of the sealing resin after 1000 hours is measured and the results are shown in Table 3.

A thin plate glass 7b of 0.005–0.1 mm provided between the rear surface member 7a of a PVF film or a PET film and the EVA sheet 2 may function as the light transmitting rear surface member 7 of a smaller water vapor transmission rate.

Figure 6:
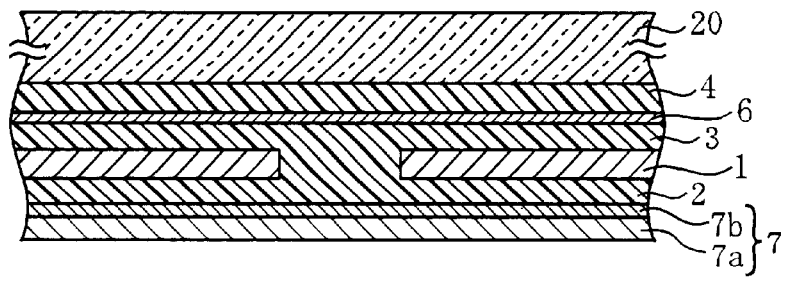
FIG. 6 is a side view of the solar cell module according to the third embodiment of this invention.

In the embodiment illustrated in FIG. 6, the PET film 6 is provided between the EVA sheets 3, 4 on a side of the front surface glass 20. Although moisture proofness enough to satisfy the JIS standard can be obtained even when the PET film 6 is not provided, that structure has the degraded moisture proofness as compared with the structure provided with the PET film 6.

TABLE 3

| | Output characteristic change (%) | | | | |
|---|---|---|---|---|---|
| | Pmax | Voc | Isc | F.F. | Na quantity/ EVA |
| 1 Conventional structure (EVA resin on a front surface side of 0.6 mm) | 99.0 | 99.8 | 99.9 | 99.3 | 0.3 μg/g |
| 2 Rear surface film is PVF film (50 μm) (the front surface EVA is 0.6 mm) | 92.0 | 98.2 | 99.3 | 94.3 | 3.0 μg/g |
| 3 Rear surface film is PET film (50 μm) (the front surface EVA is 0.6 mm) | 93.5 | 98.5 | 99.4 | 95.5 | 2.3 μg/g |
| 4 Rear surface film is PET film (100 μm) (the front surface EVA is 0.6 mm) comparison with No. 3 | 95.5 | 99.1 | 99.5 | 97.1 | 1.0 μg/g |
| 5 Rear surface film is PET film (50 μm) (the front surface EVA is 1.0 mm) comparison with No. 3 | 95.8 | 99.2 | 99.5 | 97.1 | 1.0 μg/g |
| 6 Rear surface film is PET film (50 μm), PET film inserted between the front surface EVA of 0.4 mm | 99.0 | 99.8 | 99.9 | 99.3 | 0.1 μg/g |

It is found from the table 3 that No. 4 sample using a PET film of 100 μm can maintain higher than 95% characteristics, however samples No. 2 and No. 3 can not maintain 95% characteristics. In addition, it is found from the comparison with the No. 3 sample that when the thickness of EVA resin on the front surface side increases, the sample can maintain higher than 95% characteristics. The structure shown in FIG. 5 (No. 6 sample) can maintain the characteristics as much as those of conventional examples using a lamination film which the aluminum foil is sandwiched with PVF as the rear surface member 5.

The water vapor transmission rate of the PET film of 100 μm is 6.3 g/m$^2$·day, the PVF film of 50 μm is 15 g/m$^2$·day.

Table 3 shows that the two-side incidence type structure requires to prevent transmission of water from the rear surface side as much as possible, and it can be said that material of lower water vapor transmission rate is suitable for the rear surface member 5.

Therefore, when the water vapor transmission rate of the rear surface member is not more than 6.3 g/m$^2$·day, higher than 95% of the characteristics can be maintained after 1000 hours.

Third Embodiment

The third embodiment shown in FIG. 6 uses material of low water vapor transmission rate as the rear surface member 7. The same elements as in FIG. 5 has the same reference numerals.

The plastic film illustrated in FIG. 6 is a film formed by depositing SiOx having water barrier property on the PET film 7a. With this structure, water quantity entered from the rear surface member 7 declines and migration of the sodium ions deposited from the front surface glass 20 can be suppressed. As a result, degradation of power generation performance of the solar cell can be prevented.

In the two-side incidence type solar cell module, a film of very small water vapor transmission rate is used as a rear surface member, a thickness of the EVA sheet on the front surface side increases, or a PET film is inserted between the EVA sheets in order to form a sodium diffusion preventing layer. As a result, the moisture proofness can be improved.

The EVA sheet is used as the sealing resin in the above embodiment, and silicone resin, polyvinyl chloride, PVB (polyvinyl butyral), and polyurethane may be used.

The rear surface member 7 may be heat-resistant film of PVF (polyvinyl fluoride), PVDF (polyvinylidene fluoride), FEP (tetrafluoroethylene hexafluoro propylene copolymer), ETFE (ethylene tetrafluoroethylene copolymer), PC (polycarbonate), PVC (polyvinyl chloride), or PMMA (acrylic), other than a PET film. In addition, a water vapor transmission preventing layer 7a formed by depositing inorganic oxide (aluminum oxide, silicon oxide), nitride (SiN), fluoride (HgF, CaF) or the like on the heat resistance film may be used. When the inorganic oxide or the like is deposited, the layer can function as a water vapor transmission preventing layer because of the water vapor barrier property of the inorganic oxide or the like.

Fourth Embodiment

Figure 7:
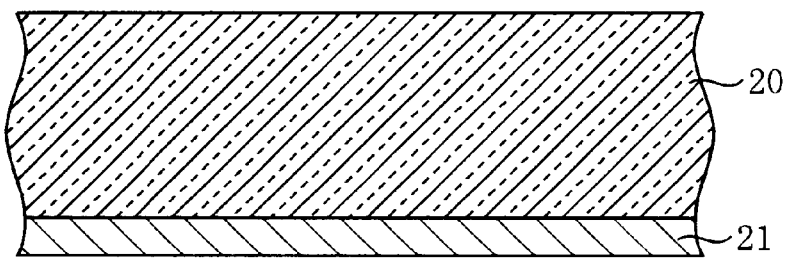
FIG. 7 is a side view of a front surface glass used in the fourth embodiment of this invention.

The solar cell module used in the fourth embodiment includes four solar cell elements 1 of a HIT structure of FIG. 1 capable of generating power on both front and rear surfaces arranged in 2×2 matrix, connected by using connection member (not shown) in series and in parallel by two units. A white plate reinforced glass is used as a front surface glass 20 as shown in FIG. 7. Furthermore, a diffusion preventing layer 21 for preventing diffusion of the sodium ions is formed on a surface contact with the sealing resin layer of the reinforced glass 20. Silicon oxide is formed by dipping as the diffusion preventing layer 21. EVA (ethylene vinyl acetate) resin is used as the sealing resin.

The rear surface member 5 is a transparent plastic film of PVF (polyvinyl fluoride).

Figure 8:
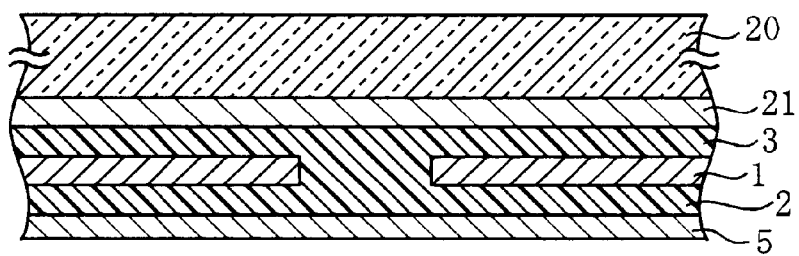
FIG. 8 is a side view of the solar cell module according to the fourth embodiment of this invention.
Figure 9:
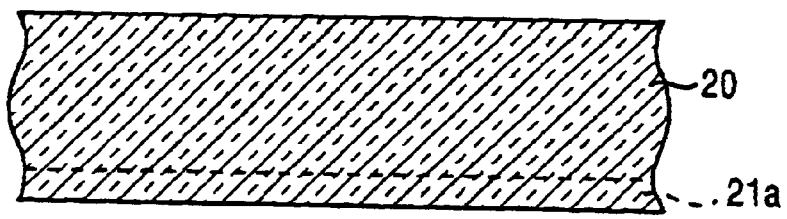
FIG. 9 is a side view of a front surface glass used in the sixth embodiment of this invention.
Figure 10:
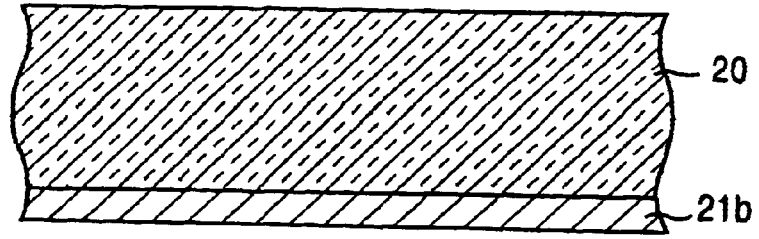
FIG. 10 is a side view of a front surface glass used in the seventh embodiment of this invention.

The solar cell module is formed by integrally laminating the front surface glass 20, the EVA sheet 3 on a front surface side, the solar cell elements 1, the EVA sheet 2 on the rear surface side, and the rear surface member 5 (a PVF film) in this order as shown in FIG. 8.

The fourth embodiment uses a white plate glass of 30 cm×30 cm×4 mm containing approximately 15 wt. % of sodium oxide ($Na_2O$).

The diffusion preventing layer 21 of silicon oxide is formed on the front surface glass 20 as follows. A white plate glass is immersed in organic solvent containing silicon oxide to coat with it and is baked at 500° C. for one hour. A thickness of the silicon oxide layer is approximately 1000 Å in the fourth embodiment.

Each of the layers is superimposed on the front surface glass 20 having the diffusion preventing layer 21 of silicon oxide formed thereon as shown in FIG. 8, and it is retained in a vacuumed bath at an approximately 100 Pa. Then, the whole layers are heated to be approximately 150° C., and is pressed by using atmospheric pressure with a silicon sheet from a side of the rear surface member 5. After softening the EVA sheets 2, 3 and tentatively adhered through this process, the structure is retained in a thermostatic bath of approximately 150° C. for one hour and the EVA sheets 2, 3 are cross-linked to form the solar cell module.

Moisture proof test (JIS C8917) is conducted to the solar cell module. In this test, the module is put in the thermostatic bath of 85° C., 93% RH for approximately 1000 hours to examine the characteristics of the solar cell. An acceptable standard of an output value is not lower than 95%. Also the test is conducted under the same condition of 85° C., 93% RH, but the retention time is increased from 1000 to 2000 hours A solar cell module, as a comparison sample, of the same condition as of the fourth embodiment except a lamination film with an aluminum foil sandwiched with the PVF film without the diffusion preventing layer 21 of silicon oxide is formed. The moisture proof test is conducted to the fourth embodiment sample and the comparison sample (a conventional structure) at the same time. The result is shown in Table 4. Also the measurement of sodium (Na) quantity in 1 g of the sealing resin after 2000 hours is shown.

TABLE 4

|  | 1000 hours | 2000 hours | Quantity of Na/EVA |
|---|---|---|---|
| Fourth embodiment | 99.5% | 97.9% | 0.5 μg/g |
| Comparison sample (conventional structure) | 99.0% | 93.9% | 2 μg/g |

It is found from Table 4 that the rate of change in characteristic of the solar cell module according to the fourth embodiment of this invention is less than that of the conventional structure after 1000 hours. It is noted that the conventional structure as like as the sample of the fourth embodiment maintains not lower than 95% of the initial characteristics and satisfies the JIS standard.

However, the output change rate of the conventional structure declines to less than 95% and the characteristics degrades after 2000 hours. On the other hand, the fourth embodiment can maintain higher than 95% of the charac- teristics after 2000 hours. The diffusion preventing layer causes difference in output in the moisture proof test. And the test proves that the diffusion preventing layer in the fourth embodiment is effective. Thus, it is found that the moisture proofness is greatly improved in the fourth embodiment as compared with the conventional structure.

Fifth Embodiment

The fifth embodiment uses a sodium diffusion preventing layer 21 of a silicon oxide layer formed by thermal CVD. The silicon oxide layer is formed by spraying dichlorosilane ($SiCl_2H_2$) and oxide nitride ($N_2O$) on a white plate glass heated to have approximately 550° C. of the substrate temperature and formed to be approximately 800 Å by thermal CVD.

The method for forming the solar cell module is the same as in the fourth embodiment. Table 5 is the result of the moisture proof test conducted as in the fourth embodiment to the solar cell module having the white plate glass of the fourth embodiment and the solar cell module formed for comparison. Measurement of quantity of sodium (Na) in 1 g of the sealing resin after 2000 hours is also shown.

TABLE 5

|  | 1000 hours | 2000 hours | Quantity of Na/EVA |
|---|---|---|---|
| Fifth embodiment | 98.5% | 96.5% | 0.7 μg/g |
| Comparison sample (conventional structure) | 99.0% | 93.9% | 2 μg/g |

The effectiveness of the diffusion preventing layer is proved in the fifth embodiment as in the fourth embodiment. The output change rate is lower than 95% in the conventional structure after 2000 hours and the characteristics are degraded. On the other hand, the fifth embodiment maintains higher than 95% of the characteristics even after 2000 hours. The sodium diffusion preventing layer makes difference of output in the moisture proof test, and it is proved that the diffusion preventing layer of the fifth embodiment is effective. Thus, the moisture proofness of the fifth embodiment is improved greatly as compared with the conventional structure.

An inorganic oxide layer such as a titan oxide layer, a tin oxide layer, a zinc oxide layer, an aluminum oxide layer, or a magnesium oxide layer, a silicon nitride layer, a magnesium fluoride layer, and a calcium of fluorine or the like may be used.

These films are formed by a process for coating and baking such as sputtering and spin-coating, other than by dipping, thermal CVD or the like.

Sixth Embodiment

Explanation is made on the sixth embodiment of this invention. In the sixth embodiment, a front surface layer 21a for preventing diffusion to serve as a means for preventing diffusion of sodium or the like is formed by reforming a surface contact with resin of the white plate glass 20.

A reforming method in the sixth embodiment is a surface reforming method referred as chemically fortifying method. In this method, the white plate glass is immersed in molten salt of alkaline metal. The sodium in the glass is molten out in the molten salt because the sodium is easy to move, and alkaline in the molten salt is diffused in the glass. When the sodium in the glass is replaced with potassium by using potassium in the molten slat, a difference of radiuses of ions (that of potassium is larger) generates compression stress only in the periphery of the glass surface, and the surface is fortified. In the sixth embodiment, a low temperature ion exchanging method is used. In the actual situation, the white plate glass is immersed for ten hours in KNO$_3$ of 450° C.

The moisture proof test is conducted to the solar cell module using the glass made by this method and the comparison sample as described in the fourth embodiment. The result of the moisture proof test is shown in Table 6. The results of measurement of sodium quantity in 1 g of the sealing resin after 2000 hours are also shown.

TABLE 6

|  | 1000 hours | 2000 hours | Quantity of Na/EVA |
|---|---|---|---|
| Sixth embodiment | 99.3% | 97.5% | 0.5 μg/g |
| Comparison sample (conventional structure) | 99.0% | 93.9% | 2 μg/g |

From Table 6, it is found that the surface layer of the sixth embodiment is effective for preventing diffusion of sodium.

The sixth embodiment uses a low temperature ion exchanging method, and other methods such as a high temperature ion exchanging method are also available. In the high temperature ion exchanging method, ions are exchanged in a region of higher than an annealing point (approximately 550° C.) of glass and an alkaline ion (lithium or the like) of a smaller ion size than that of the sodium.

Other methods for reforming a surface include de-alkalifying, spraying or the like. With these methods, the sodium on the glass surface is eliminated and reduced, or replaced, and the same effect as in the above embodiment is expected to achieve.

Seventh Embodiment

Explanation on the seventh embodiment is made. The seventh embodiment uses a surface material 21b containing less sodium to form a bonded glass which the surface material 21b is bonded on a side of a surface contact with resin of the glass 20 to serve as means for preventing diffusion of sodium or the like. In the seventh embodiment, low-alkaline glass 21b containing 5 wt. % of sodium is used. The method for forming the solar cell module is same as in the first embodiment.

The moisture proof test is conducted to the sample of the seventh embodiment and the samples of the conventional structure for comparison. The result is shown in Table 7. Also, the measurement of quantity of sodium (Na) in 1 g of the sealing resin after 2000 hours is shown.

TABLE 7

|  | 1000 hours | 2000 hours | Quantity of Na/EVA |
|---|---|---|---|
| 7th embodiment | 98.3% | 96.1% | 0.7 μg/g |
| Comparison sample (conventional structure) | 99.0% | 93.9% | 2 μg/g |

From Table 7, the bonded glass with the surface material of the seventh embodiment is proved to be effective.

Other surface material containing less sodium may be resin or the like.

The seventh embodiment uses the bonded glass, and other surface glass such as low-alkaline glass and non-alkaline glass provide the same effect.

In the fourth to seventh embodiment, the two-side incidence type solar cell module is used, and the same effect can be obtained in using the one-side incidence type solar cell module.

In the embodiments, the solar cell elements of the HIT structure is used, and other type of solar cell module using crystalline solar cell elements and amorphous solar cell elements are also applicable to this invention.

As described above, this invention can suppress deposition of sodium ions form the front surface glass, retard degradation of power generation performance of the solar cell element, and provide the solar cell module highly reliable capable of withstanding long-term use in the outside.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What we claim is:

1. A solar cell module comprising:

a light transmitting on a front surface side of the solar cell module containing at least sodium;

a rear surface member;

a plurality of solar cell elements disposed between the light transmitting member and the rear surface member, wherein a side of each solar cell element facing the light transmitting member is sealed with sealing resin and a side of each solar cell element facing the rear surface member is sealed with sealing resin; and a sodium diffusion preventive function layer for preventing diffusion of sodium from the light transmitting member; wherein the sodium diffusion preventive function layer is arranged between the light transmitting member and the solar cell elements, and wherein the sodium diffusion preventive function layer is a resin layer of smaller water vapor transmission rate than that of the sealing resin.

2. A solar cell module comprising:

a light transmitting member on a front surface side of the solar cell module containing at least sodium;

a rear surface member;

a plurality of solar cell elements disposed between the light transmitting member and the rear surface member, wherein a side of each solar cell element facing the light transmitting member is sealed with sealing resin and a side of each solar cell element facing the rear surface member is sealed with sealing resin; and a sodium diffusion preventive function layer for preventing diffusion of sodium from the light transmitting member; wherein the sodium diffusion preventive function layer is arranged between the light transmitting member and the solar cell elements, the sodium diffusion preventive function layer is a resin layer of smaller water vapor transmission rate than that of the sealing resin, and wherein the resin layer is a resin film inserted between the light transmitting member and the solar cell elements.

3. A solar cell module comprising:

a light transmitting member on a front surface side of the solar cell module containing at least sodium;

a rear surface member;

a plurality of solar cell elements disposed between the light transmitting member and the rear surface member, wherein a side of each solar cell element facing the light transmitting member is sealed with sealing resin and a side of each solar cell element facing the rear surface member is sealed with sealing resin; and a sodium diffusion preventive function layer for preventing diffusion of sodium from the light transmitting member; wherein the sodium diffusion preventive function layer is arranged between the light transmitting member and the solar cell elements, the sodium diffusion preventive function layer is a resin layer of smaller water vapor transmission rate than that of the sealing resin, the resin layer is a resin film inserted between the light transmitting member and the solar cell elements, and wherein the resin film is a PET film.

* * * * *